United States Patent
Aritome

(10) Patent No.: US 8,116,135 B2
(45) Date of Patent: Feb. 14, 2012

(54) NON-VOLATILE MEMORY CELL READ FAILURE REDUCTION

(75) Inventor: Seiichi Aritome, Zhudong (TW)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/917,241

(22) Filed: Nov. 1, 2010

(65) Prior Publication Data

US 2011/0047422 A1    Feb. 24, 2011

Related U.S. Application Data

(62) Division of application No. 12/566,202, filed on Sep. 24, 2009, now Pat. No. 7,826,274, which is a division of application No. 12/246,543, filed on Oct. 7, 2008, now Pat. No. 7,609,557, which is a division of application No. 11/512,500, filed on Aug. 30, 2006, now Pat. No. 7,450,425.

(51) Int. Cl.
*G11C 11/34* (2006.01)
(52) U.S. Cl. .......... 365/185.17; 365/185.19; 365/185.22
(58) Field of Classification Search ............. 365/185.17, 365/185.19, 185.22
See application file for complete search history.

(56) References Cited

U.S. PATENT DOCUMENTS

| | | | |
|---|---|---|---|
| 6,768,673 B1 | 7/2004 | Hsaia et al. | |
| 6,839,875 B2 | 1/2005 | Roohparvar | |
| 6,937,522 B2 | 8/2005 | Funaki | |
| 6,972,993 B2 | 12/2005 | Conley et al. | |
| 7,012,835 B2 | 3/2006 | Gonzalez et al. | |
| 2003/0179616 A1 | 9/2003 | Wohlfart et al. | |
| 2005/0024943 A1* | 2/2005 | Chen et al. | 365/185.22 |
| 2005/0081114 A1 | 4/2005 | Ackaret et al. | |
| 2005/0081132 A1 | 4/2005 | Chen | |
| 2005/0094440 A1 | 5/2005 | Tu et al. | |
| 2005/0172065 A1 | 8/2005 | Keays | |
| 2005/0268203 A1 | 12/2005 | Keays et al. | |
| 2006/0114729 A1 | 6/2006 | Tanaka et al. | |

* cited by examiner

*Primary Examiner* — Jason Lappas
(74) *Attorney, Agent, or Firm* — Brooks, Cameron & Huebsch, PLLC

(57) ABSTRACT

The present disclosure includes various method, device, and system embodiments for reducing non-volatile memory cell read failures. One such method embodiment includes performing a first read operation, using an initial read potential, to determine a state of a selected memory cell in a string of non-volatile memory cells. This method includes determining whether the state of the selected memory cell is an incorrect state by performing a first check using a data checking technique, and if the incorrect state is determined, performing a number of subsequent read operations using read potentials stepped to a higher and a lower read potential to a particular count of read operations.

22 Claims, 11 Drawing Sheets

NON-VOLATILE MEMORY CELL READ FAILURE REDUCTION

CROSS-REFERENCE TO RELATED APPLICATIONS

This application is a Divisional of U.S. patent application Ser. No. 12/566,202 filed Sep. 24, 2009 which is a divisional of U.S. application Ser. No. 12/246,543 filed Oct. 7, 2008 now U.S. Pat. No. 7,609,557 issued Oct. 27, 2009, which is a divisional of U.S. application Ser. No. 11/512,500 filed Aug. 30, 2006, now U.S. Pat. No. 7,450,425 issued Nov. 11, 2008, the specifications of which are incorporated by reference herein.

TECHNICAL FIELD

The present disclosure relates generally to semiconductor devices and, more particularly, to memory devices having non-volatile memory cells.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory, among others.

Flash memory devices are utilized as non-volatile memory for a wide range of electronic applications. Flash memory devices typically use a one-transistor memory cell that allows for high memory densities, high reliability, and low power consumption.

Uses for flash memory include memory for personal computers, personal digital assistants (PDAs), digital cameras, and cellular telephones. Program code and system data, such as a basic input/output system (BIOS), are typically stored in flash memory devices. This information can be used in personal computer systems, among others.

Two common types of flash memory array architectures are the "NAND" and "NOR" architectures, so called for the logical form in which the basic memory cell configuration of each is arranged. In the NOR array architecture, the floating gate memory cells of the memory array are typically arranged in a matrix.

The gates of each floating gate memory cell of the array matrix are typically coupled by rows to word select lines and their drains are coupled to column bit lines. The NOR architecture floating gate memory array is accessed by a row decoder activating a row of floating gate memory cells by selecting the word select line coupled to their gates. The row of selected memory cells then place their data values on the column bit lines by flowing different currents depending on if a particular cell is in a programmed state or an erased state.

A NAND array architecture also arranges its array of floating gate memory cells in a matrix such that the gates of each floating gate memory cell of the array are coupled by rows to word select lines. However each memory cell is not directly coupled to a column bit line by its drain. Instead, the memory cells of the array are coupled together in series, source to drain, between a source line and a column bit line.

Memory cells in a NAND array architecture can be configured, e.g., programmed, to a desired state. That is, electric charge can be placed on or removed from the floating gate of a memory cell to put the cell into a number of stored states. For example, a single level cell (SLC) can represent two binary states, e.g., 1 or 0. Flash memory cells can also store more than two binary states, e.g., 00, 01, 10, or 11. Such cells may be referred to as multi state memory cells, multibit cells, or multilevel cells (MLCs). MLCs can allow the manufacture of higher density memories without increasing the number of memory cells since each cell can represent more than one bit. MLCs can have more than one programmed state, e.g., a cell capable of representing two bits can have three programmed states and an erased state.

Reading of memory cells can be accomplished by applying an appropriate voltage to the control gate and the drain and comparing the drain to source current, which can indicate the voltage threshold (Vt) of the cell, against a reference current, e.g., a "trip point," to determine the state of the memory cell. In an example data read operation, 0 volts can be applied to a selected word line, e.g., to the control gate of a cell or cells in the selected word line. A read pass voltage of about 5 volts can be applied to unselected word lines, e.g., to the control gates of cells in the unselected word lines. The drain to source current, e.g., the "cell current," or "drain current," flowing through cells on the selected word line, is indicative of the binary logic state of the cell.

As such, when the cell current of a particular memory cell is above the trip point, the memory cell is read as having a particular state, e.g., an erased state or a programmed state. When the cell current of the particular memory cell is below the trip point, the memory cell is read as having a different state. Therefore, a desired configured state of the memory cell, e.g., 00, 01, 10, or 11, depends on whether the cell current is above or below the trip point.

Memory cells having a state other than their desired/expected configured state, e.g., the state into which they were programmed, represent data errors in data being read. Many memory devices and/or systems employ an error checking technique such as correction code (ECC) checking to detect bit errors in data, e.g., cells having incorrect states. The ECC codes can be associated with groups of cells, e.g., memory blocks, memory segments, or memory sectors, and can reduce read failures by detecting and possibly correcting bit errors. Examples of ECC codes include, Hamming codes, Reed-Solomon (RS) codes, Bose-Chaudhuri-Hochquenghem (BCH) codes, circular redundancy check (CRC) codes, Golay codes, Reed-Muller codes, Goppa codes, and Denniston codes, among others.

Read failures occur when accessed data bits, e.g., memory cells representing information retrieved by a processor, have incorrect states. Reducing read failures increases the operational reliability of memory devices and/or systems. Error checking/correcting techniques may not be able to correct more than a threshold number of erroneous bits. Furthermore, many error checking techniques may not even be able to detect more than a particular number of erroneous bits for a given group of cells, e.g., a data word or data sector.

Therefore, the read failure rate increases as the number of memory cells having incorrect states increases. The state of a memory cell can be incorrect for several reasons. For example, random telegraph signal noise (RTS) can shift the Vt of a memory cell, which can in turn result in a modified cell current. This cell current modification can cause marginal cells, e.g., cells having a cell current near the trip point, to switch from a correct state to an incorrect state. The Vt shifts and associated cell current shifts caused and by RTS can effect greater numbers of cells as cell read margins are reduced as scaling of memory devices improves, etc.

DETAILED DESCRIPTION

In the following detailed description of the present disclosure, reference is made to the accompanying drawings that form a part hereof, and in which is shown by way of illustration how various embodiments of the disclosure may be practiced. These embodiments are described in sufficient detail to enable those of ordinary skill in the art to practice the embodiments of this disclosure, and it is to be understood that other embodiments may be utilized and that process, electrical, or mechanical changes may be made without departing from the scope of the present disclosure.

The present disclosure includes various method, device, and system embodiments for reducing non-volatile memory cell read failures. One such method embodiment includes performing a first read operation, using an initial read potential, to determine a state of a selected memory cell in a string of non-volatile memory cells. This method includes determining whether the state of the selected memory cell is an incorrect state by performing a first check using a data checking technique, and if the incorrect state is determined, performing a number of subsequent read operations using read potentials stepped to a higher and a lower read potential to a particular count of read operations.

Figure 1A:
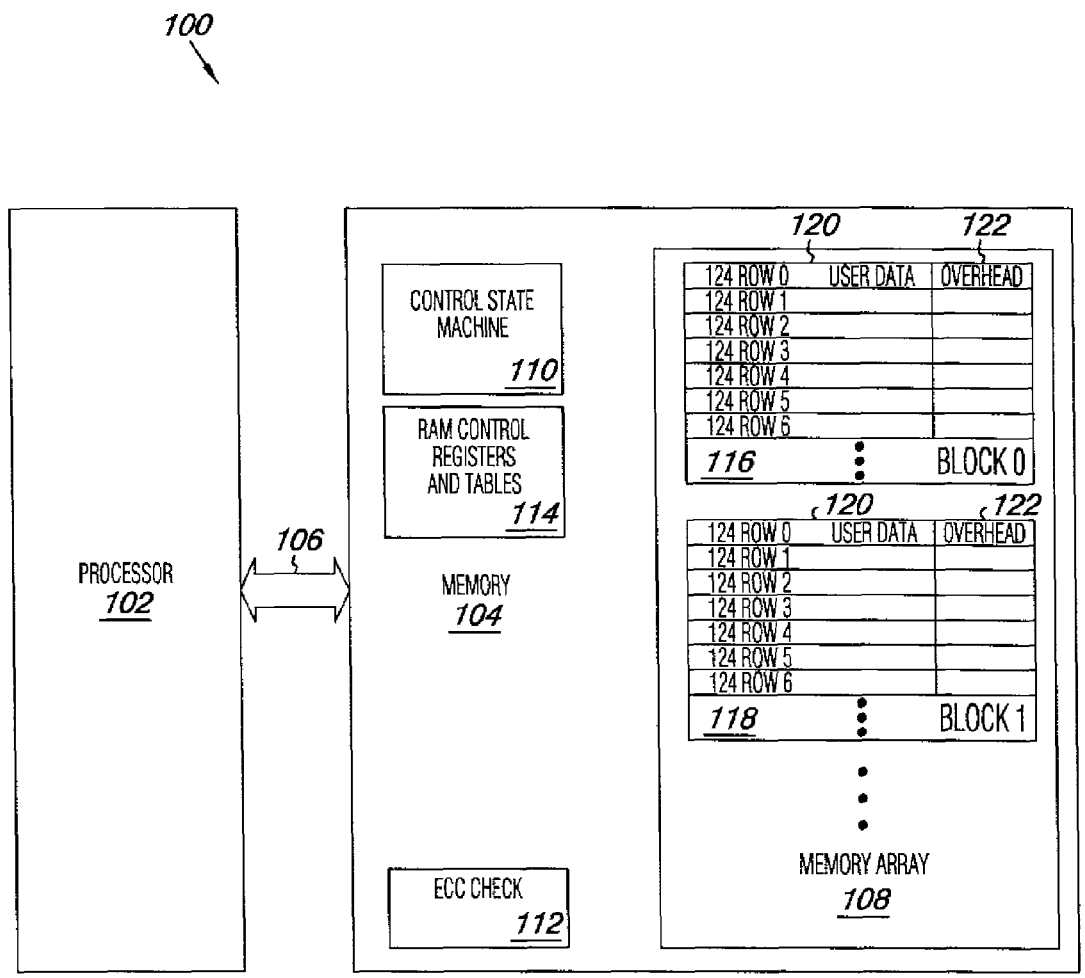
FIG. 1A is a block diagram of an electronic system having a memory device in accordance with an embodiment of the present disclosure.

FIG. 1A is a block diagram of an electronic system 100 having a memory device 104 in accordance with an embodiment of the present disclosure. In the system 100, the memory device 104 is coupled to a processor 102 with an address/data bus 106. In the embodiment of FIG. 1A, the memory device 104 includes a control state machine 110 that directs internal operation of the memory device 104. The control state machine 110 can perform functions including managing the memory array 108 and updating RAM control registers and tables 114, among various other functions.

The memory array 108 contains floating gate memory cells arranged in a sequence of memory blocks 116, 118. The blocks 116, 118 contain a series of physical pages/rows (shown as "Row 0," "Row 1," etc.), each page containing one or more logical sectors 124 (shown here for illustration purposes as a single logical sector 124 per physical page/row) that contain a user data space 120 and a control/overhead data space 122 (shown as "OVERHEAD"). The overhead data space 122 contains overhead information for operation of the sector 120, such as an error correction code (ECC), status flags, or an erase block management data field area (not shown).

The RAM control registers and tables 114 can be loaded at power up from the non-volatile erase block management registers and tables (not shown) by the control state machine 110. The user data space 120 in each logical sector 124 can be 512 bytes long. It is noted that other interfaces to the Flash memory 104 and formats for the blocks 116, 118, physical pages, and sectors 124 are possible. For example, the physical pages of the memory blocks 116, 118 can include multiple sectors 124 which can include more or less than 512 bytes of data. In the embodiment shown in FIG. 1A, the memory device 104 contains ECC checking hardware 112 that can be used in conjunction with various embodiments of the present disclosure.

Figure 1B:
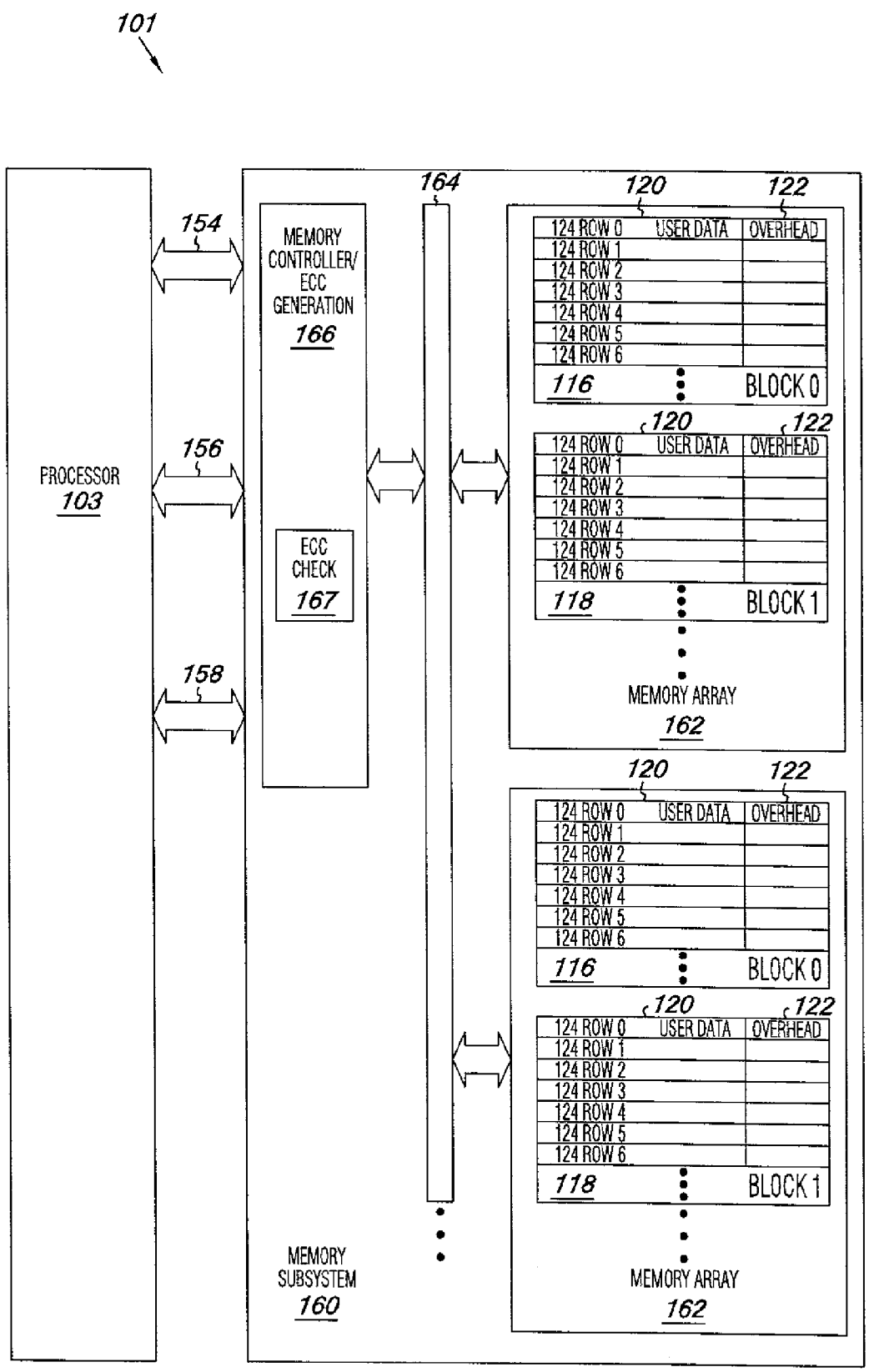
FIG. 1B is a block diagram of another electronic system having a memory device in accordance with an embodiment of the present disclosure.

When memory cells are read, an ECC check can be performed to reduce and or prevent read failures. Some ECC codes include, Hamming codes, Reed-Solomon (RS) codes, Bose-Chaudhuri-Hochquenghem (BCH) codes, circular redundancy check (CRC) codes, Golay codes, Reed-Muller codes, Goppa codes, and Denniston codes. As an example, when a sector of data in a memory array, e.g., array 108 in FIG. 1A, is written to, the appropriate ECC codes are generated and stored in the bits reserved for them, e.g., in overhead data space 122. When the sector is read back, the user data 120 read, combined with the FCC bits in overhead data space 122, can tell the controller 110 if any errors occurred during the read. Errors that can be corrected by the ECC check 167, shown in FIG. 1B, are corrected before passing the data to the rest of the system. Many ECC circuits 167 system can tell when there is too much damage to the data to correct, and will issue an error notification, e.g., an ECC failure and/or read failure, in that event.

The number of bits (cells) that are correctable depends on the particular ECC algorithm used. Embodiments of the present disclosure are not limited to any one particular ECC technique, and some embodiments can employ multiple different error checking techniques. As one example, the capability of a Reed Solomon ECC implementation is based on the number of additional ECC bits it includes, e.g., on the number of bits in the overhead data 122. The more overhead bits 122 included for a given amount of user data 120, the more errors that can be determined and/or corrected.

FIG. 1B is a block diagram of another electronic system 101 having a memory device in accordance with an embodiment of the present disclosure. In the embodiment illustrated in FIG. 1B, the electronic system 101 includes a memory subsystem 160, e.g., a flash memory card, coupled to a processor 103 with an address 154, control 156, and data bus 158. In this embodiment, the memory subsystem 160 includes a memory controller 166 which can direct internal operation of the subsystem 160. The memory controller 166 can perform functions such as managing the memory arrays 162, directing data accesses, updating internal control registers and tables (not shown), and/or directing operation of other possible hardware systems (not shown) of the memory subsystem 160.

In various embodiments, and as shown in the embodiment of FIG. 1B, the memory controller 166 includes internal ECC checking hardware 167 that can be used in conjunction with embodiments of the present disclosure. The memory controller 166 may optionally incorporate a small local embedded processor to help manage the memory subsystem 160. The memory controller 166 is coupled to and controls one or more memory arrays 162 via an internal control bus 164. Memory arrays 162 can include flash memory arrays, e.g., NAND or NOR arrays, and/or other arrays of non-volatile memory cells. It is noted that other memory architectures, memory systems 160, external interfaces 154, 156, 158, and manners of coupling the memory controller 166 to the memory arrays 162, such as directly coupled individual control busses and signal lines, are possible and should be apparent to those of ordinary skill in the art.

In the embodiment illustrated in FIG. 1B, the memory arrays 162 each contain a sequence of memory blocks 116, 118 in their internal memory arrays. Each block 116, 118 contains a series of physical pages, each physical page having one or more logical sectors 124 that contain a user data space 120 and a control/overhead data space 122 (shown as "OVERHEAD"). The overhead data space 122 can contain an ECC code and/or other overhead information for operation of the logical sectors 124, such as status flags, or a memory block management data field area (not shown). For illustration, each physical page/row (shown as "Row 0," "Row 1," etc.) in the embodiment of FIG. 1B includes a single logical sector 124. However, embodiments can have several logical sectors, e.g., 4, 8, 10, 12, or 16 logical sectors, among other numbers of logical sectors.

Figure 2:
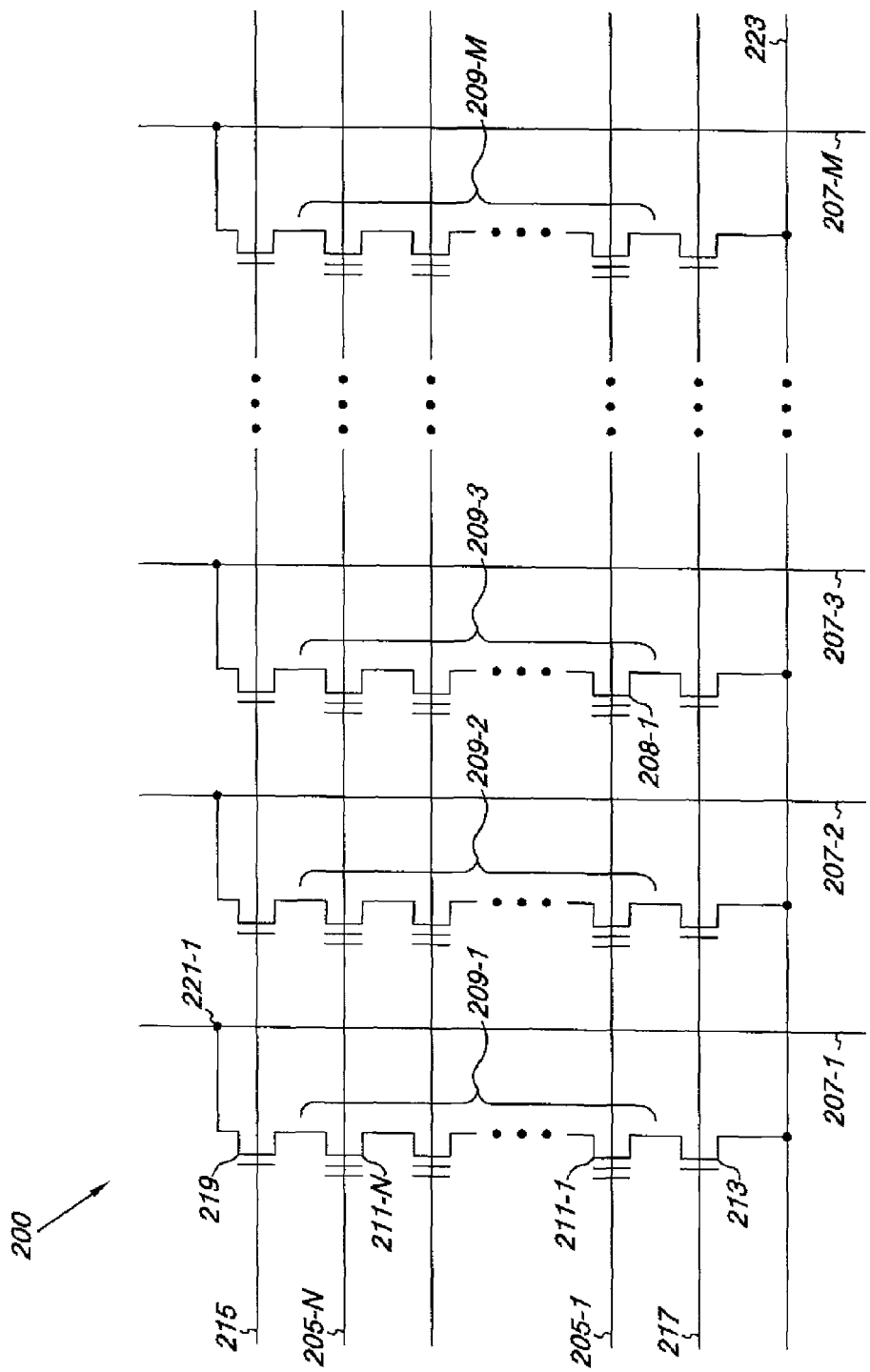
FIG. 2 is a schematic of a portion of a NAND memory array that can be used with embodiments of the present disclosure.

FIG. 2 is a schematic of a portion of a NAND memory array 200 that can be used with embodiments of the present disclosure. As shown in FIG. 2, the memory array 200 includes word lines 205-1, ..., 205-N and intersecting bit lines 207-1, ..., 207-M. For ease of addressing in the digital environment, the number of word lines 205-1, ..., 205-N and the number of bit lines 207-1, ..., 207-M are each some power of two, e.g., 256 word lines by 4,096 bit lines.

Memory array 200 includes NAND strings 209-1, ..., 209-M. Each NAND string includes non-volatile memory cells 211-1, ..., 211-N, each located at an intersection of a word line 205-1, ..., 205-N and a local bit line 207-1, ..., 207-M. The non-volatile memory cells 211-1, ..., 211-N of each NAND string 209-1, ..., 209-M are connected in series source to drain between a source select gate (SGS), e.g., a field-effect transistor (FET) 213, and a drain select gate (SGD), e.g., FET 219. Source select gate 213 is located at the intersection of a local bit line 207-1 and a source select line 217 while drain select gate 219 is located at the intersection of a local bit line 207-1 and a drain select line 215.

As shown in the embodiment illustrated in FIG. 2, a source of source select gate 213 is connected to a common source line 223. The drain of source select gate 213 is connected to the source of the memory cell 211-1 of the corresponding NAND string 209-1. The drain of drain select gate 219 is connected to the local bit line 207-1 for the corresponding NAND string 209-1 at drain contact 221-1. The source of drain select gate 219 is connected to the drain of the last memory cell 211-N, e.g., floating-gate transistor, of the corresponding NAND string 209-1.

In various embodiments, construction of non-volatile memory cells, 211-1, ..., 211-N, includes a source, a drain, a floating gate or charge storage layer, and a control gate. Non-volatile memory cells, 211-1, ..., 211-N, have their control gates coupled to a word line, 205-1, ..., 205-N respectively. A column of the non-volatile memory cells, 211-1, ..., 211-N, make up the NAND strings, e.g., 209-1, ..., 209-M, coupled to a given local bit line, e.g., 207-1, ..., 207-M respectively. A row of the non-volatile memory cells are commonly coupled to a given word line, e.g., 205-1, ..., 205-N. An AND array architecture would be similarly laid out except that the string of memory cells would be coupled in parallel between the select gates.

Figure 3:
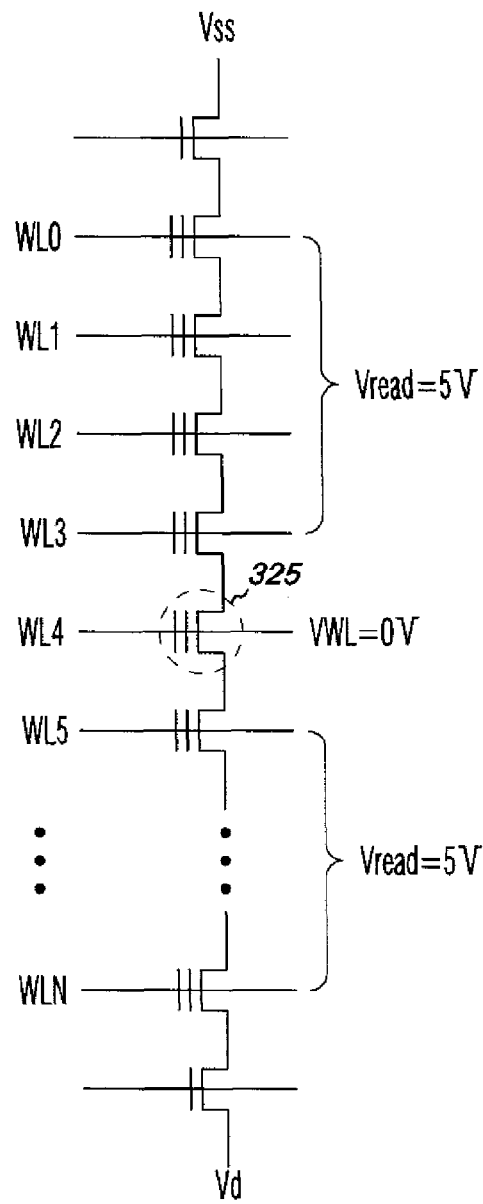
FIG. 3 illustrates a NAND string having a cell to be read.

FIG. 3 illustrates a NAND string, e.g., NAND string 209-1 as shown in FIG. 2, having a cell 325 to be read. The embodiment illustrated in FIG. 3 shows the bias conditions during a read operation. One of ordinary skill in the art will appreciate that the same or similar bias conditions can be applied during a program verify operation. In various embodiments, during a read operation, a word line voltage (VWL) of 0 volts is applied to the word line of a memory cell to be read, e.g., a cell whose current state is to be determined. In this example, a VWL of 0 volts is applied to word line four (WL4) in the NAND string to read memory cell 325.

In order to determine the current state of a memory cell, e.g., cell 325, a read voltage (Vread) is applied to the word lines of other cells, e.g., cells adjacent the memory cell being read, in the NAND string to turn those cells on. For this reason, Vread can be referred to as a read pass voltage. The word line of the memory cell being read is referred to as a selected word line, while the adjacent word lines are referred to as unselected word lines. As used herein, adjacent word lines can refer to word lines directly adjacent a selected word line, e.g., word lines three and five (WL3 and WL5) are adjacent to selected word line four (WL4) in FIG. 3. Adjacent word lines can also refer to some or all unselected word lines in a memory block, e.g., blocks 116 and 118 of FIGS. 1A and 1B. For instance, in the example shown in FIG. 3, some or all of unselected word lines WL0 to WLN can be considered adjacent to the selected word line (WL4).

Under the bias conditions shown in FIG. 3, the voltage threshold (Vt) and/or drain current (cell current), which is indicative of the binary state of the memory cell, can be determined, e.g., whether the drain current is above or below the trip point. In the embodiment illustrated in FIG. 3, a Vread of 5 volts is applied to word lines WL0-WL3 and WL5-WLN in order to read cell 325 on WL4. In various embodiments of the present disclosure, other read voltages both higher and lower than 5 volts may be used. Embodiments are not limited to this example.

As previously mentioned, many memory devices and/or systems, e.g., systems 100 and 101 shown in FIGS. 1A and 1B, respectively, can use an error checking technique such as ECC to determine whether a memory cell and/or a group of cells, e.g., a data word, or sector, is erroneous, e.g., has an incorrect state. An erroneous or incorrect state can refer to a state of a memory cell other than the one into which it was programmed or written. For example, non-volatile memory cells can be programmed into a particular logic state, e.g., 1 or 0, and can undergo a program verify operation to confirm that the cell was programmed to the desired correct state.

The cell current (Id) and/or cell threshold voltage (Vt) of some memory cells can shift after being programmed and verified due to such factors as random telegraph signal noise (RTS). RTS refers to 1/f noise that may be the result of the trapping and detrapping of charge carriers, e.g., electrons, in transistors and other small electronic devices. The shift in cell current (Id) and/or cell threshold voltage (Vt) can cause a memory cell to have an incorrect state, and the RTS shift can become greater and/or more problematic as cell read margins are reduced. Drain current (Id) and/or threshold voltage (Vt) shifts due to RTS and/or various other factors can cause erroneous data bits. When the number of erroneous data bits is above a threshold number of bits correctable by a particular error checking/correcting technique, an ECC failure, or data read failure, results. ECC failures and/or read failure reductions would be beneficial since such failures decrease system performance and possibly result in memory system failures.

As described further in connection with FIGS. 5-10 below, various embodiments of the present disclosure can reduce the ECC failure rate and/or read failure rate by performing multiple data read operations. In various situations, the drain current (Id) and/or threshold voltage (Vt) shift of one or more memory cells may be remedied and result in changing the state of one or more of the cells from an incorrect state, e.g., erroneous state, back to a correct state. According to various embodiments, multiple data read operations are performed to reduce the number of incorrect bits, e.g., erroneous bits, which can result in increasing the number of bits correctable by the ECC technique such that FCC failures are reduced or prevented.

For example, consider an electronic system that accesses, e.g., reads, data words having a width of 32 bits. Also, assume the ECC can correct up to 4 bits having an incorrect state. In this example, if five or more bits in the data word are erroneous after a read operation, the subsequent ECC check will result in a ECC failure. However, embodiments of the present disclosure can result in a subsequent ECC check "pass" by causing one or more erroneous bits, e.g., cells having an incorrect state, to have a correct state. In various embodiments, a ECC check pass can refer to a ECC check that results in a determination that the number of bits having an incorrect state is below the threshold number correctable by the ECC. In some embodiments, a ECC check pass can refer to a ECC check that results in a determination that the data being read has no cells with an incorrect state.

According to embodiments of the present disclosure as described below in connection with FIGS. 5-10, performing subsequent read operations on cells previously producing a ECC fail can result in a subsequent ECC pass. For instance, in the example above, a first read operation may result in a ECC fail because 5 of the 32 bits are determined to be incorrect, for example. However, a subsequent FCC check of a subsequent read operation can result in a ECC pass if the subsequent read operation caused one or more of the 5 erroneous bits to be changed to the correct state. It is noted that embodiments are not limited to 32 bit data words, e.g., data words can be 4, 8, 16, 64, or more bits wide.

Figure 4:
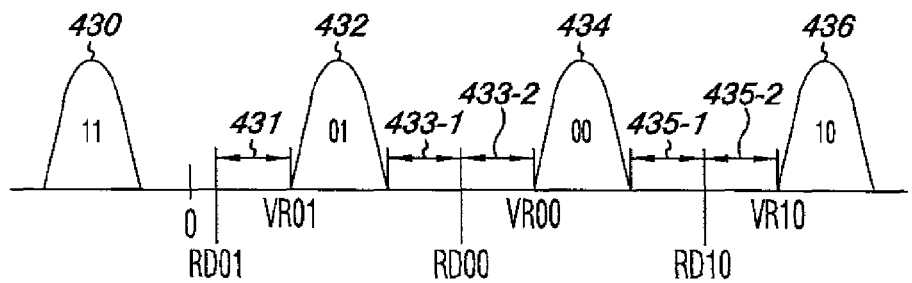
FIG. 4 illustrates a distribution of voltage thresholds of a group of non-volatile memory cells that have been individually programmed into one of four states.

FIG. 4 illustrates a distribution of voltage thresholds of a group of non-volatile memory cells that have been individually programmed into one of four states. Although there are many forms of memory cells having various numbers of states per memory cell, an array with four states per memory cell (e.g., a storage element) has been chosen for illustrative purposes. In such arrays, two bits of data can be stored in each memory cell.

In the embodiment represented by the illustration of FIG. 4, the programmed storage elements form memory cell transistors with threshold levels that fall into one of four threshold distributions ranges, e.g., 430, 432, 434, or 436. The distribution range 430 represents the erased state, or erase level, and is also one of the programmed states, e.g., a "11" in FIG. 4. The distribution 430 reflects cells having a negative threshold voltage Vt.

The distribution ranges 432, 434, and 436 reflects cells having positive threshold voltages. In the embodiment of FIG. 4, the distribution range 432 represents data bits having a second programmed state, e.g., a "01" state. The distribution range 434 represents data bits having a third programmed state, e.g., a "00" state, and the distribution range 436 represents data bits having a fourth programmed state, e.g., a "10" state. The distributions 432, 434, and 436 can be referred to as a number of program levels. An additional number of states, and thus more bits, may be programmed into each storage element. That is, embodiments are not limited to a system with four states, e.g., one erase level and three program levels.

Upon programming user data and/or block overhead data into a number of memory cells forming all or a portion of a memory block, programming voltage pulses are applied to those cells whose state is to be changed from the erase state, e.g., "11", to something else. For those transistors to be programmed into state "01" out of erase state "11", the pulsing is terminated when their Vt become equal to or greater than the program verify level VR01, within the distribution 432. The states of the cells can be verified in between the programming pulses.

Similarly, pulsing is terminated for those storage transistors to be programmed into the "00" state when their Vt become equal to or greater than the program verify level VR00, within the distribution 434. Finally, for those storage element transistors being programmed into the "10" state, the program pulses are terminated when their Vt reach their program verify level VR10, within the distribution 436. At that point, the parallel programming of the group of the memory cells has been completed. In various embodiments, the individual program verify levels VR01, VR00, and VR10 are coincident with the lower margins of their respective distribution ranges 432, 434 and 436.

FIG. 4 also illustrates the read reference voltages used to determine into which of the four threshold states the cell has been programmed. The read reference voltage levels RD01, RD00, and RD10 are reference voltages used to read the "01", "00" and "10" storage states, respectively. These are the read threshold voltages with which the threshold voltage state of each memory cell transistor being read is compared. This can be accomplished by comparing a current, e.g., drain current (Id), or voltage threshold (Vt) measured from the cell with reference currents or voltages, respectively.

In various embodiments, the read reference voltages can be positioned roughly halfway between adjacent ones of the voltage distribution ranges 430, 432, 434 and 436. As an example, RD01 may be about 0.1 V, RD00 may be about 1.0V, and RD 10 may be about 1.9V. Also, the program verify voltages VR01, VR00, and VR10 associated with the read voltages RD01, RD00, and RD10, respectively, may have respective voltages of about 0.2V, 1.2, and 2.2V.

The difference between a program verify level and a corresponding read reference level can be referred to herein as a read margin. The distribution illustrated in FIG. 4 includes read margins 431, 433-1, 433-2, 435-1, and 435-2. A memory cell programmed into the "00" state can become erroneous if the Vt level moves below the reference read level RD00 such that the threshold level is not within read margin 433-2. In this example, the memory cell would be read as being in an incorrect state, e.g., the "01" state. Similarly, the "00" cell would be read as having an incorrect state, e.g., the "10" state, if the threshold level were above the reference read level RD10. As the reader will appreciate, narrower read margins can increase the likelihood of erroneous bits as relatively small Vt level shifts can cause the threshold level to shift across a reference read level from a correct to an incorrect state. As mentioned above, such data errors can be detected and possibly corrected by a ECC checking process.

Figure 5A:
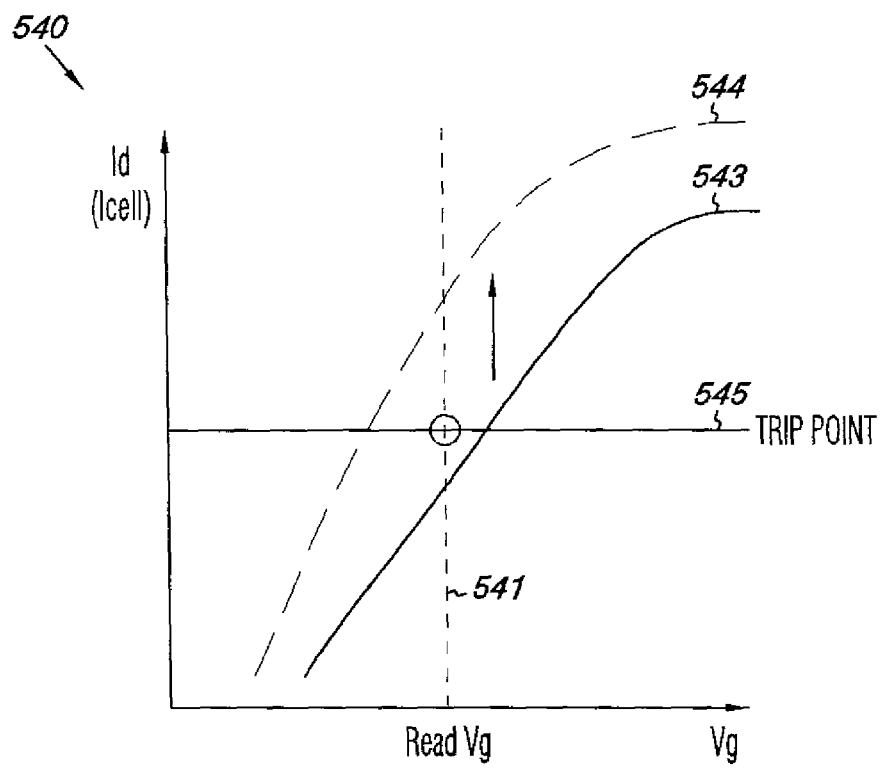
FIGS. 5A-5B illustrate Id-Vg (cell current-gate voltage) characteristics for a non-volatile memory cell before and after read operations performed according to embodiments of the present disclosure.
Figure 5B:
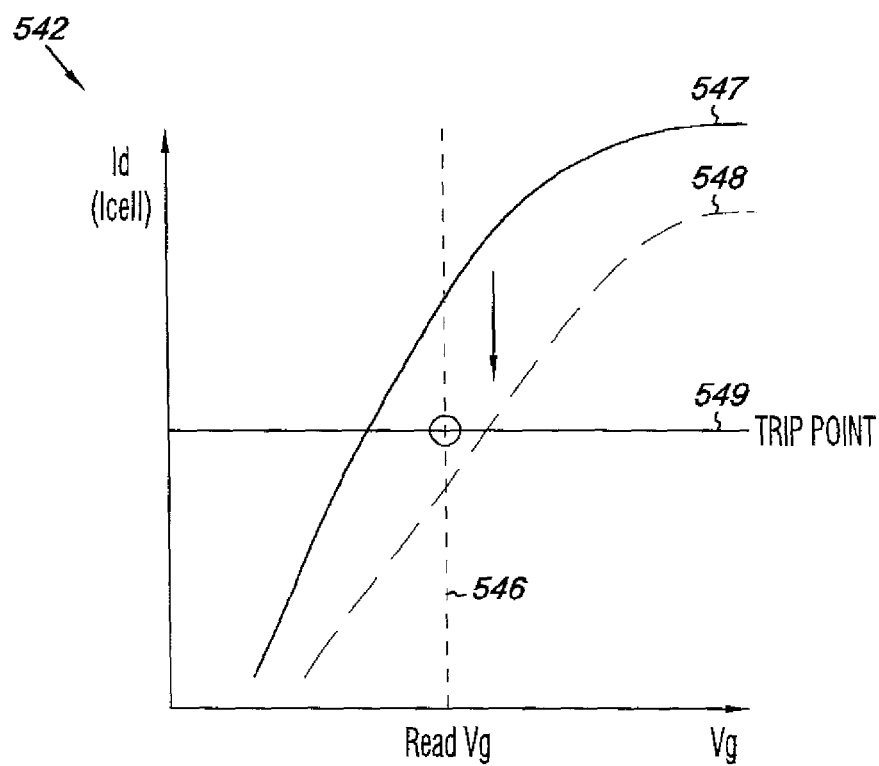

FIGS. 5A-5B illustrate Id-Vg (cell current-gate voltage) characteristics for a non-volatile memory cell before and after read operations performed according to embodiments of the present disclosure. FIGS. 5A-5B illustrate Id-Vg characteristics for a SLC, however embodiments of the present disclosure are applicable to MLCs as well.

FIG. 5A illustrates the Id-Vg characteristics 540 for a memory cell having an initial state which is an erroneous state. In this example, the initial state 543 represents an erroneous programmed state, e.g., logic 0. That is, the drain to source current (shown as Id or Icell) is initially below the trip point 545 at a particular gate voltage (Read Vg) 541. As previously mentioned, the trip point is a threshold reference current to which a memory cell's drain to source current (Id) can be compared during a read operation to determine the state of the cell. The Id corresponding to state 543 at Read Vg may represent the initial, erroneous cell current prior to any read operations and/or may represent the cell current after one or more subsequent read operations The embodiment of FIG. 5A also illustrates a subsequent state 544, which is a correct state, e.g., an erased state (logic 1) in this example, effectuated according to embodiments described herein. That is, the performance of one or more subsequent data read operations results in an upward shift in the Id of the memory cell being read, such that the Id is increased to above the trip point 545. For instance, in this example, the application of one or more subsequent read operations stepped to a higher read potential has increased the Id (Icell) such that the cell moves to the correct state. As discussed herein, the correct state, e.g., logic 1, can be checked using a ECC. In various embodiments, the correction of one or more erroneous states can reduce the number of erroneous states to below a threshold number of erroneous states correctable by an FCC checking technique such that an ECC failure and/or data read failure is prevented.

FIG. 5B illustrates the Id-Vg characteristics 542 for a memory cell having an initial state which is an erroneous state. In this example, the initial state 547 represents an erroneous programmed state, e.g., logic 1. That is, the drain to source current (shown as Id or Icell) is initially above the trip point 549 at a particular gate voltage (Read Vg) 546. As previously mentioned, the trip point is a threshold reference current to which a memory cell's drain to source current (Id) can be compared during a read operation to determine the state of the cell. The Id corresponding to state 547 at Read Vg may represent the initial cell current prior to any read operations and/or may represent the cell current after one or more subsequent read operations The embodiment of FIG. 5B also illustrates a subsequent state 548, which is a correct state, e.g., a programmed state (logic 0) in this example, effectuated according to embodiments described herein. That is, the performance of one or more subsequent data read operations results in a downward shift in the Id of the memory cell being read, such that the Id is decreased to below the trip point 549. For instance, in this example, the application of one or more subsequent read operations stepped to a lower read potential has decreased the Id (Icell) such that the cell moves to the correct state, e.g., logic 0.

As discussed below in connection with FIGS. 8-10, various embodiments of the present disclosure can perform a number of subsequent read operations using read potentials stepped to both a higher and a lower read potential to a particular count of read operations. In various embodiments, it is possible for several memory cells, e.g., data bits, to be corrected. That is, several cells having a cell current that reflects an incorrect state, e.g., a state other than the state into which the cell was programmed, can be placed into a correct state, having a modified or changed cell current, as effectuated by subsequent read operations using the same and/or different read potentials. According to various embodiments, the cell current modification resulting from subsequent read operations can be an increased cell current or a decreased cell current as described in FIGS. 5A and 5B. As used herein, the read potential used in an initial and in subsequent read operations refers to the potential applied to one or more word lines adjacent to the selected memory cell whose state is being read, e.g., unselected word lines.

FIGS. 6-10 illustrate various flow diagrams for performing read operations according to embodiments of the present disclosure. The methods described by the flow diagrams are capable of modifying the cell current of memory cells being read in order to reduce ECC and/or read failures. Also, as described below, the various embodiments can be used to optimize a read potential to be used in subsequent read operations. For example, performing various embodiments of the present disclosure can result in a selection of a read potential which results in an increased amount of bit corrections and accommodates an increased capability for bit corrections by an error checking technique. That is, an increased amount of bit corrections can reduce the number of bits which remain to be corrected by a ECC technique and/or may reduce the number of erroneous bits to within a threshold number of erroneous bits that is correctable by the ECC.

In the embodiments illustrated in FIGS. 6-10, it is assumed that the cells being read are in a NAND memory array and that a selected word line potential (VWL), e.g., ground potential (0 volts), is applied to the word line of a selected cell or group of cells being read. It is also assumed that the read potential (Vread), e.g., 3 volts, 5 volts, 7 volts, etc., is applied to each of the other word lines in the NAND string. Embodiments, however, are not limited to these example architectures and/or potentials. That is, various embodiments can include memory architectures other than NAND architectures and embodiments are not limited to a selected word line potential (VWL) of ground (0V) applied to the selected cells being read nor to the example read potentials (Vread) applied to the unselected word lines, e.g., adjacent word lines. Furthermore, embodiments are not limited to having the same read potential applied to each of the word lines in a non-volatile memory cell string.

Figure 6:
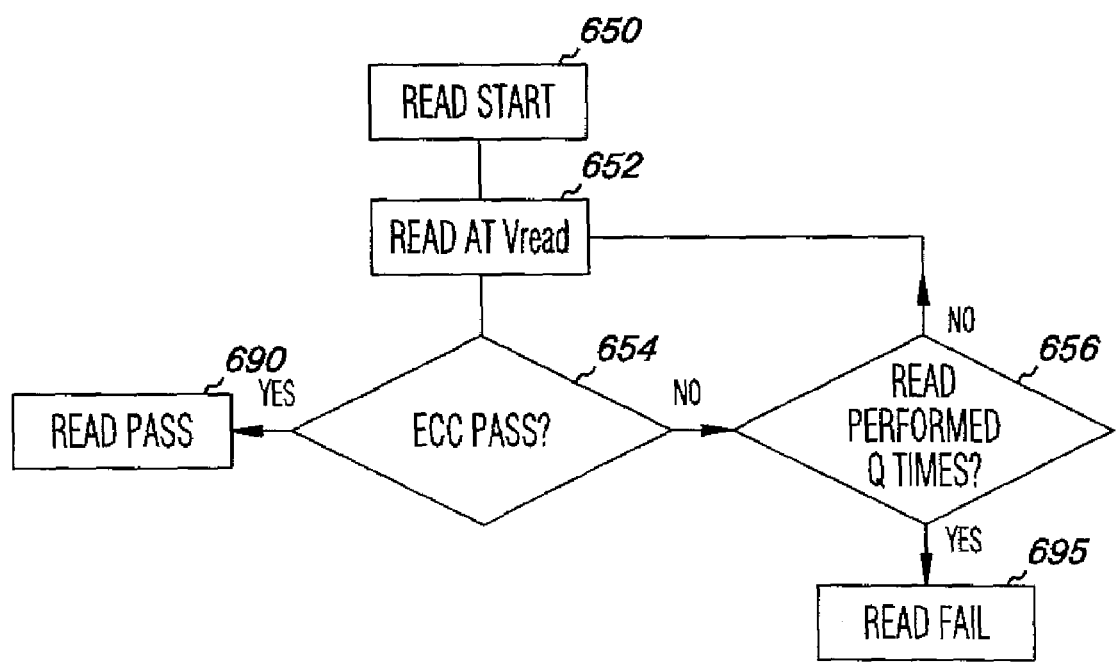
FIG. 6 illustrates a flow diagram for performing read operations according to an embodiment of the present disclosure.

FIG. 6 illustrates a method for reducing read failures according to an embodiment of the present disclosure. At step 650 a data read is initiated. The read can be initiated by a control state machine, a memory controller, a processor, etc., associated with the memory array. In various embodiments, a control state machine, controller, etc., and memory array can be integrated into a single chip and/or may be interconnected by buses, among other types of arrangements. The read initiation can result in the generation of a read address, which can be decoded by support circuitry associated with the memory array.

At step 652 an initial read operation is performed at an initial read potential Vread, e.g., using an initial read potential of about 4.5 to 5.5 volts, by applying the initial read potential to the word lines adjacent the selected word line being read. That is, the selected cell or cells, e.g., data word, corresponding to the requested read address can be read by having a selected word line potential (VWL) applied to their associated word line and an initial read potential (Vread) applied to the unselected word lines in the array in order to determine the states of the selected cell or cells.

At step 654 the read data is checked using a ECC technique to determine whether the data contains erroneous bits and whether the erroneous bits are correctable by the ECC. In various embodiments, the ECC check can be implemented in hardware and/or software, and can be performed by circuitry on a memory chip that includes one or more memory arrays. Alternatively, the ECC check can be performed by ECC circuitry of a controller that may or may not be located on a memory chip. However, performing the ECC checks on chip may be beneficial due to the increased checking time associated with off chip ECC checking.

In the event that the ECC check passes, the read data can be provided to the controller at step 690, e.g., READ PASS, which can use the correct data to execute a process or to perform some other function. In various embodiments, a ECC check pass can occur when the data contains no errors, e.g., when each of the states of the cells being read has a correct state. In various embodiments, a ECC check pass can also occur when the data being read contains a number of erroneous bits which are correctable by the ECC. The threshold number of bits correctable by a ECC can depend on the particular ECC technique or techniques being employed. Some ECC techniques can correct for single bit errors, while others can correct for double bit errors or other higher numbers of bit errors. In instances in which the read data includes fewer than the threshold number of cells correctable by the ECC, the ECC can correct the erroneous bits prior to providing the read data to a controller.

On the other hand, if the ECC check does not result in a ECC pass, e.g., the read data includes a number of incorrect bits which are not correctable by the ECC or includes more than the threshold number of erroneous bits correctable by the particular ECC, then a check is performed at step 656 of whether the particular count of the number of subsequent read operations has been exceeded. That is, in the embodiment illustrated in FIG. 6, a number, e.g., "Q" in this example, of subsequent read operations are performed using the Vread read potential. In this embodiment, the subsequent read operations and subsequent ECC checks are performed until a subsequent ECC check results in a ECC pass or until the subsequent read operations have been repeated Q times. In the embodiment of FIG. 6, Q can be a number such as 3, 5, or 10, among various other numbers.

In the event that the read operation is performed Q times, a read failure is indicated at step 695. A read failure can reduce or prevent the erroneous read data from being provided to a controller which can reduce or prevent the likelihood of a system failure.

Figure 7:
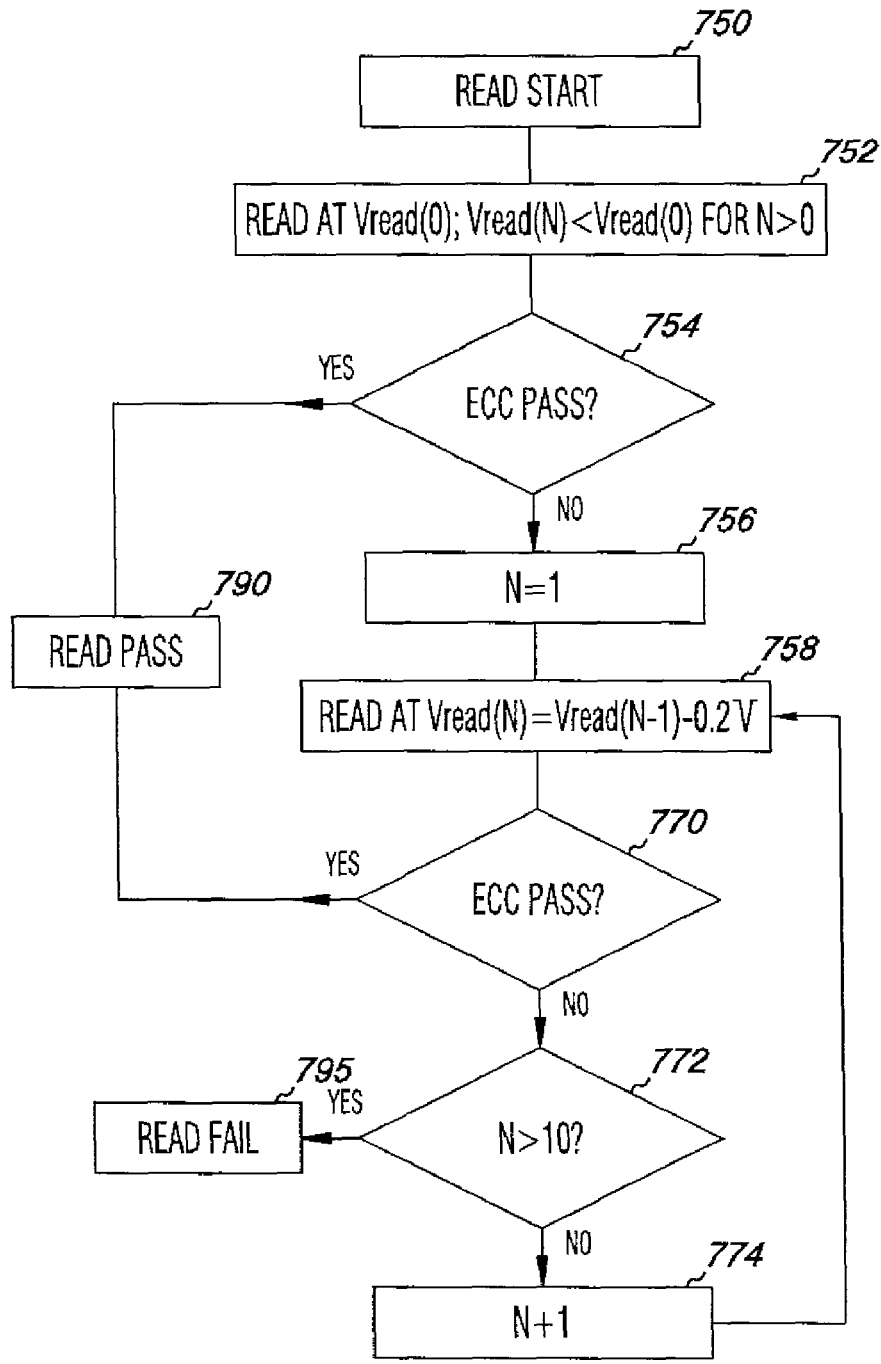
FIG. 7 illustrates another flow diagram for performing read operations according to an embodiment of the present disclosure.

FIG. 7 illustrates another method for reducing read failures according to an embodiment of the present disclosure. At step 750 a data read is initiated. The read initiation can result in the generation of a read address, which can be decoded by support circuitry associated with the memory array.

At step 752 an initial read operation is performed at an initial read potential Vread(0), e.g., by using an initial read potential of about 4.5 to 5.5 volts. That is, the cell or cells, e.g., data word, corresponding to the requested read address can be read, e.g., their states can be determined, by applying the initial read potential to the unselected word lines, e.g., word lines adjacent the word line being read. In the embodiment illustrated in FIG. 7, Vread(N) represents subsequently applied read potentials lower than the initial read potential Vread(0) for values of N greater than 0. The indicator "N" is used as a counter such that Vread(1) is a first subsequent lower read potential and Vread(2) is a second subsequent lower read potential, etc.

At step 754 the read data is checked using a ECC technique to determine whether the data contains erroneous bits and whether the erroneous bits are correctable by the ECC. In the event that the ECC check passes, the read data can be provided to a controller at step 790, e.g., READ PASS, which can use the provided data to execute a process or to perform some other function.

On the other hand, if the ECC check 754 does not result in a ECC pass, e.g., the read data includes erroneous bits which are not correctable by the ECC or includes more than the threshold number of erroneous bits correctable by the particular ECC, then N is set to 1 at step 756 and a first subsequent read operation is performed at step 758 using a lower read potential Vread(N). As shown at 758, in this embodiment, the first subsequent lower read operation, Vread(1), is performed using a potential that is 0.2 volts lower than the initial read potential Vread(0).

At step 770 a ECC check is performed. An ECC check pass results in a READ PASS at step 790. An ECC check pass at 770 can occur if the read data no longer includes erroneous bits or no longer includes more than a threshold number of erroneous bits. For instance, a ECC pass can result if the subsequent read operation, e.g., Vread(1) modified the cell current of one or more memory cells such that their states changed from an incorrect to a correct state or no longer includes more than a threshold number of erroneous bits.

If ECC check 770 does not result in a ECC pass, then at step 772 it is determined whether a particular count of subsequent read operations or ECC checks have occurred, e.g., whether N is greater than 10. In various embodiments the particular count of subsequent read operations or ECC checks can be more or less than 10. For example, in various embodiments the particular count of subsequent read operations is at least two. In some embodiments, the particular count of subsequent read operations is at least four. In some embodiments, the particular count of subsequent read operations can be 3, 5, 8, 15, among other values. In the event that N is greater than the count, a read failure is indicated at step 795.

If it is determined that the particular count of read operations has not been exceeded, e.g., N is less than 10 as shown at 772, then N is incremented at step 774 and next subsequent read operations are performed at lower read potentials until a ECC check pass occurs or until N reaches the particular count of subsequent operations. In this embodiment, each subsequent read operation uses a read potential that is stepped lower by increments of 0.2 volts as shown at 758. However, embodiments are not limited to a particular stepped increment. That is, subsequent reads can be performed using stepped increments other than 0.2 volts, e.g., 0.1 volts, 0.25 volts, 0.3 volts, 0.5 volts, 1.0 volts, etc. Also, in some embodiments, the subsequent read operation can use read potentials stepped at different increments. For instance, if the initial Vread is 5.0 volts, then Vread(1) can be 4.8 volts, Vread(2) can be 4.5 volts, and Vread(0) can be 4.0 volts.

It is noted that in various embodiments, an ECC check is performed after each subsequent read operation, while in some embodiments, the ECC checks may occur after a particular number of subsequent read operations. It is also noted that Vread(N) can represent a read potential higher than the initial read potential Vread(0). That is, the subsequent read operations can use read potentials stepped to higher potentials than the initial read potential. For instance, if the initial Vread is 5.0 volts, then Vread(0) can be 5.2 volts, Vread(2) can be 5.4 volts, etc. As described below in FIGS. 8-10, in various embodiments the subsequent read operations can also be stepped to both a higher and a lower read potential.

Figure 8:
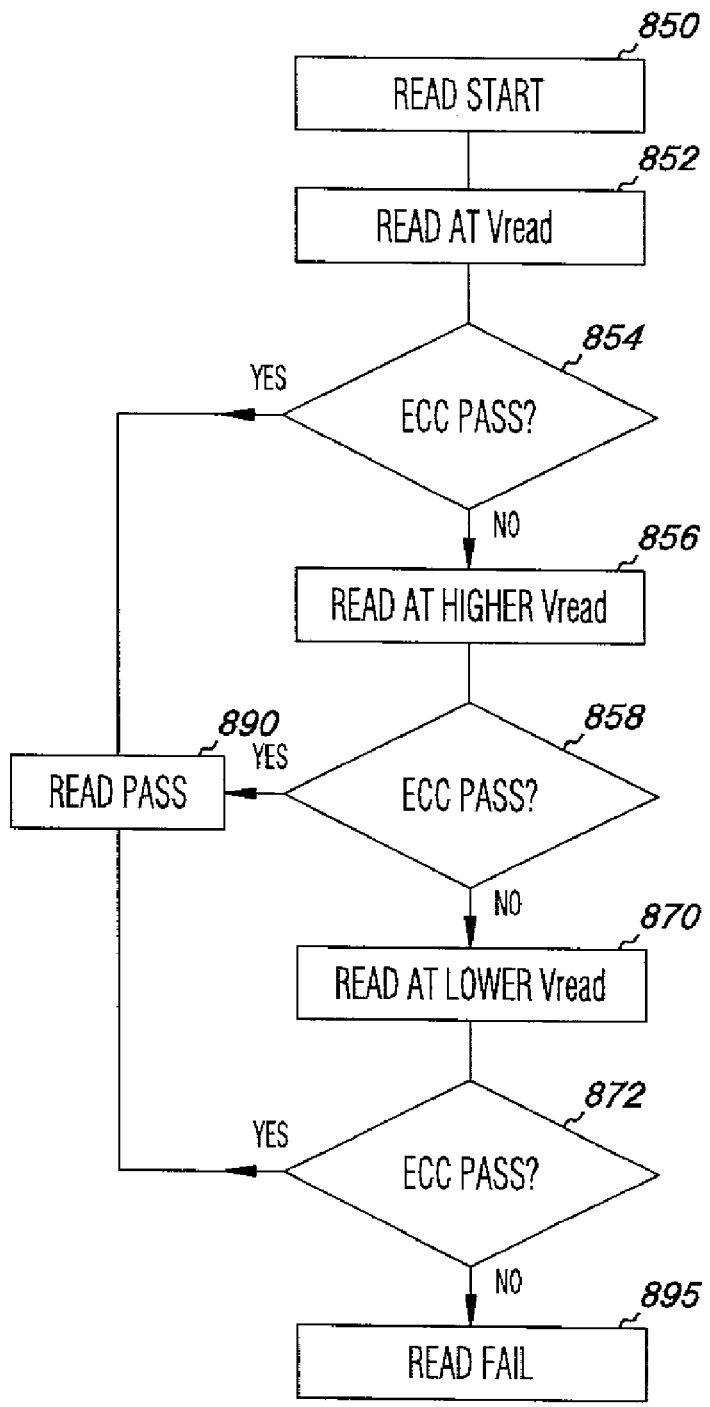
FIG. 8 illustrates another flow diagram for performing read operations according to an embodiment of the present disclosure.

FIG. 8 illustrates another method for reducing read failures by performing read operations according to an embodiment of the present disclosure. At step 850 a data read is initiated.

The read initiation can result in the generation of a read address, which can be decoded by support circuitry associated with the memory array.

At step 852 an initial read operation is performed at an initial read potential Vread, e.g., by using an initial read potential of about 4.5 to 5.5 volts. That is, the cell or cells, e.g., data word, corresponding to the requested read address can be read, e.g., their states can be determined, by applying the initial read potential to the word lines adjacent the word line being read.

At step 854 the read data is checked using a ECC technique to determine whether the data contains erroneous bits and whether the erroneous bits are correctable by the ECC. In the event that the ECC check passes, the read data can be provided to a controller at step 890, e.g., READ PASS, which can use the provided data to execute a process or to perform some other function, e.g., continue memory array operations.

On the other hand, if the ECC check 854 does not result in a ECC pass, e.g., the read data includes erroneous bits which are not correctable by the ECC or includes more than the threshold number of erroneous bits correctable by the particular ECC, then a first subsequent read operation is performed at step 856 using a higher read potential. The higher read potential includes different values higher than an initial Vread. For example, if an initial Vread is 5.0 volts, then the higher Vread can be 5.1, 5.5, or 6.0 volts, among various other potentials.

At step 858 a first subsequent ECC check is performed, e.g., a first ECC check after the initial check 854. An ECC check pass at 858 results in a READ PASS at step 890. An EEC check pass at 858 can occur if the read data no longer includes erroneous bits or no longer includes more than a threshold number of erroneous bits. For instance, a ECC pass can result if the subsequent higher potential read operation modified the cell current of one or more memory cells such that their states changed from an incorrect to a correct state.

If ECC check 858 does not result in a FCC pass, then at step 870 a second subsequent read operation is performed using a lower read potential. In various embodiments, the lower read potential is lower than the initial read potential Vread, e.g., the lower read potential can be 4.5 volts if the initial Vread is 5.0 volts, for instance. In some embodiments, the lower read potential can be lower than the first subsequent read potential, e.g., the higher read potential, but higher than the initial read potential. For instance, if the initial read potential 852 is 5.0 volts and the first subsequent read potential 856 is 5.5 volts, then the second subsequent read potential 870, e.g., the lower Vread, can be 5.2 volts, 5.4 volts, etc.

At step 872 a second subsequent ECC check is performed. An ECC check pass at 872 results in a READ PASS at step 890. An ECC check pass at 872 can occur if the read data no longer includes erroneous bits or no longer includes more than a threshold number of erroneous bits, e.g., 1, 2, 3, 5, 8 bits, among other numbers that may depend on the particular ECC. For instance, a ECC pass can result if the subsequent higher potential read operation modified the cell current of one or more memory cells such that their states changed from an incorrect to a correct state. If ECC check 872 does not result in a ECC pass, then a READ FAIL is indicated at step 895.

In various embodiments, steps 856 and 870 can be interchanged such that the read operation using a lower potential is performed before the read operation using the higher read potential is performed. In some embodiments a subsequent ECC check can be performed only after both the first and second subsequent read operations have been performed.

In various embodiments, the method of FIG. 8 can reduce read failure occurrences. For example, a programmed block of memory cells in a NAND flash array can include multiple failure bits, e.g., cells that can be read to have an incorrect state. When a group of memory cells, e.g., a data word, in the programmed block is read, the group can include a number of marginal failure cells, e.g., bits in an incorrect state. Marginal failure cells can refer to cells, which when read using a given read potential, have a cell current (Id) that is relatively close to the trip point for a particular correct state, e.g., the marginal failure cell would be read as having the correct state if the cell current were shifted. For example, if a trip point is about 100 milliamps, then a marginal failure cell may have a cell current that is about 5-10 milliamps away from the trip point.

In cases in which a group of cells being read includes such marginal cells, performing subsequent read operations according to various embodiments of the present invention can shift the cell current in marginal cells such that one or more marginal cells changes from an incorrect to a correct state. In such embodiments, a subsequent ECC check pass can occur when a prior ECC check on the same cells resulted in a ECC fail.

Figure 9:
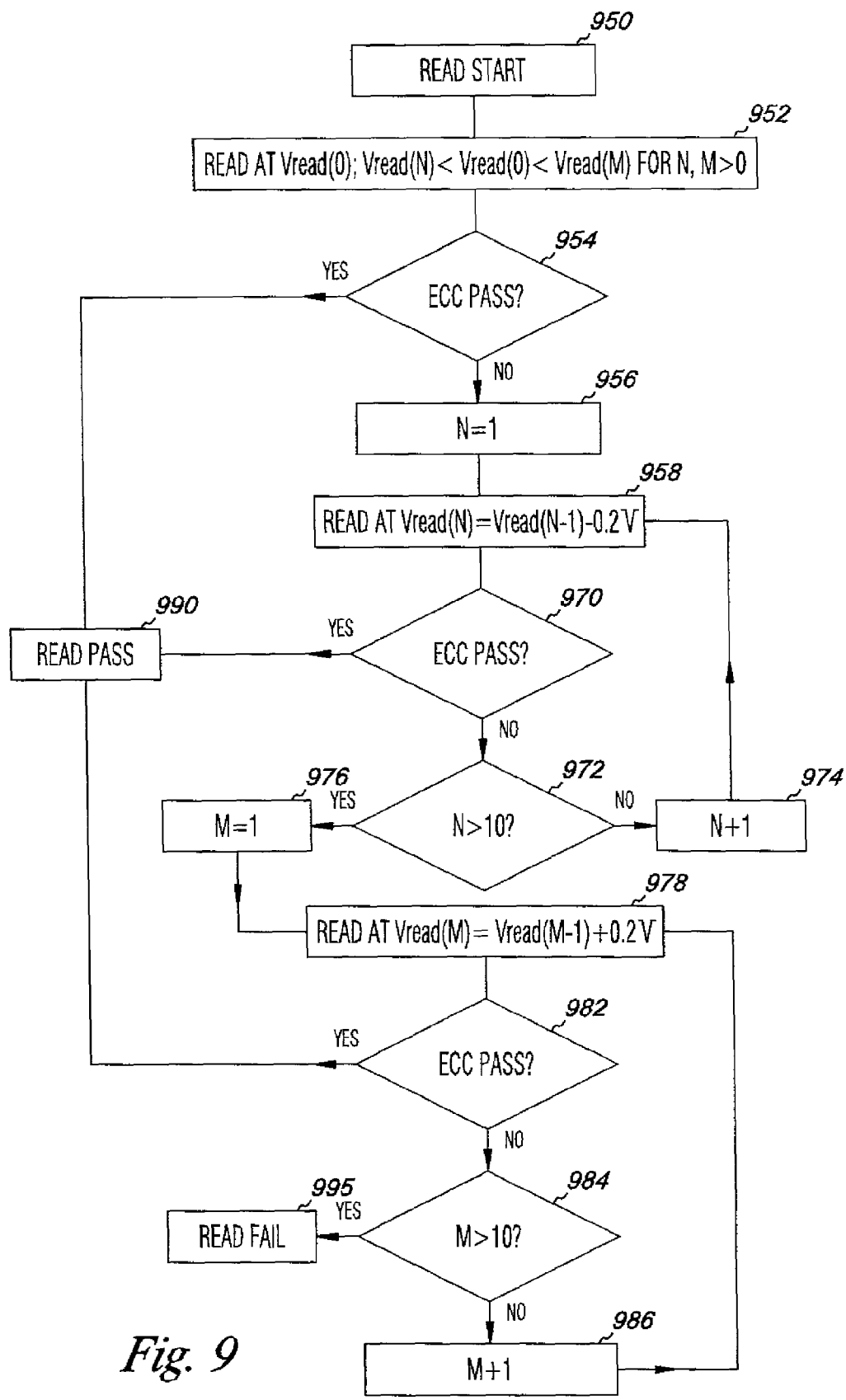
FIG. 9 illustrates another flow diagram for performing read operations according to an embodiment of the present disclosure.

FIG. 9 illustrates another method for reducing read failures according to an embodiment of the present disclosure. At step 950 a data read is initiated. The read initiation can result in the generation of a read address, which can be decoded by support circuitry associated with the memory array.

At step 952 an initial read operation is performed at an initial read potential Vread(0), e.g., by using an initial read potential of about 4.5 to 5.5 volts. That is, the cell or cells, e.g., data word, corresponding to the requested read address can be read, e.g., their states can be determined, by applying the initial read potential to the word lines adjacent the word line being read.

In the embodiment illustrated in FIG. 9, Vread(N) represents subsequently applied read potentials lower than the initial read potential Vread(0) for values of N greater than 0. Also, Vread(M) represents subsequently applied read potentials higher than the initial read potential. Vread(0) for values of M greater than 0. In the embodiment of FIG. 9, the indicator "N" is used as a counter such that Vread(N=1) is a first subsequent lower read potential and Vread(N=2) is a second subsequent lower read potential, etc. Similarly, the indicator "M" is used as a counter such that Vread(M=1) is a first subsequent higher read potential and Vread(M=2) is a second subsequent higher read potential, etc.

At step 954 the read data is checked using a FCC technique to determine whether the data contains erroneous bits and whether the erroneous bits are correctable by the ECC. In the event that the ECC check passes, the read data can be provided to a controller at step 990, e.g., READ PASS, which can use the provided data to execute a process or to perform some other function.

On the other hand, if the ECC check 954 does not result in a ECC pass, then N is set to 1 at step 956 and a first subsequent lower read operation is performed at step 958 using a lower read potential Vread(N). As shown at 958, in this embodiment, the first subsequent lower read operation, Vread(N=1), is performed using a potential that is 0.2 volts lower than the initial read potential Vread(0).

At step 970 a first subsequent ECC check is performed. An ECC check pass at 970 results in a READ PASS at step 990. An ECC check pass at 970 can occur if the read data no longer includes erroneous bits or no longer includes more than a threshold number of erroneous bits. For instance, a ECC pass can result if the first subsequent lower read operation modified the cell current of one or more memory cells such that their states changed from an incorrect to a correct state.

If ECC check 970 does not result in a FCC pass, then at step 972 it is determined whether a particular count of subsequent lower read operations or ECC checks have occurred, e.g., whether N is greater than 10. In various embodiments the particular count of subsequent lower read operations or ECC checks can be more or less than 10. For example, in various embodiments the particular count of subsequent lower read operations is at least two. In some embodiments, the particular count of subsequent read operations is at least four. In some embodiments, the particular count of subsequent lower read operations can be 1, 3, 5, 8, or 15, among other values.

If it is determined that the particular count of lower read operations has not been exceeded, e.g., N is less than 10 as shown at 972, then N is incremented at step 974 and next subsequent lower read operations are performed at lower read potentials until a ECC check pass occurs at 970 or until N reaches the particular count of subsequent operations. In this embodiment, each subsequent lower read operation uses a next lower read potential that is stepped lower by increments of 0.2 volts as shown at 958. However, embodiments are not limited to a particular stepped increment. That is, subsequent lower potential reads can be performed using stepped increments other than 0.2 volts, e.g., 0.1 volts, 0.25 volts, 0.3 volts, 0.5 volts, 1.0 volts, etc. Also, in some embodiments, the subsequent lower read operation can use read potentials stepped at different increments. For instance, if the initial Vread(0) is 5.0 volts, then Vread(N=1) can be 4.8 volts, Vread(N=2) can be 4.5 volts, and Vread(N=3) can be 4.0 volts.

In the event that N reaches the particular count of lower read operations, the counter M is set to one at step 976 and a first subsequent higher read operation is performed at step 978 using a higher read potential Vread(M). As shown at 978, in this embodiment, the first subsequent higher read operation, Vread(M=1), is performed using a potential that is 0.2 volts higher than the initial read potential Vread(0).

At step 982 a subsequent ECC check is performed. An ECC check pass at 982 results in a READ PASS at step 990. If ECC check 982 does not result in a ECC pass, then at step 984 it is determined whether a particular count of subsequent higher read operations or ECC checks have occurred, e.g., whether M is greater than 10. In various embodiments the particular count of subsequent higher read operations or ECC checks can be more or less than 10. For example, in various embodiments the particular count of subsequent higher read operations is at least two. In some embodiments, the particular count of subsequent read operations is at least four. In some embodiments, the particular count of subsequent higher read operations can be 1, 3, 5, 8, or 15, among other values.

In the event that M is greater than the particular count of lower read operations, a read failure is indicated at step 995. On the other hand, if it is determined that the particular count of higher read operations has not been exceeded, e.g., M is less than 10 as shown at 984, then M is incremented at step 986 and next subsequent higher read operations are performed at higher read potentials until a ECC check pass occurs at 982 or until M reaches the particular count of subsequent operations. In this embodiment, each subsequent higher read operation uses a next higher read potential that is stepped higher by increments of 0.2 volts as shown at 978. However, embodiments are not limited to a particular stepped increment. That is, subsequent higher potential reads can be performed using stepped increments other than 0.2 volts, e.g., 0.1 volts, 0.25 volts, 0.3 volts, 0.5 volts, 1.0 volts, etc. Also, in some embodiments, the subsequent higher read operation can use read potentials stepped at different increments. For instance, if the initial Vread(0) is 5.0 volts, then Vread(M=1) can be 5.2 volts, Vread(M=2) can be 5.5 volts, and Vread (M=3) can be 6.0 volts.

It is noted that in various embodiments, the number of subsequent higher read operations can be performed before the number of subsequent lower read operations are performed.

Figure 10:
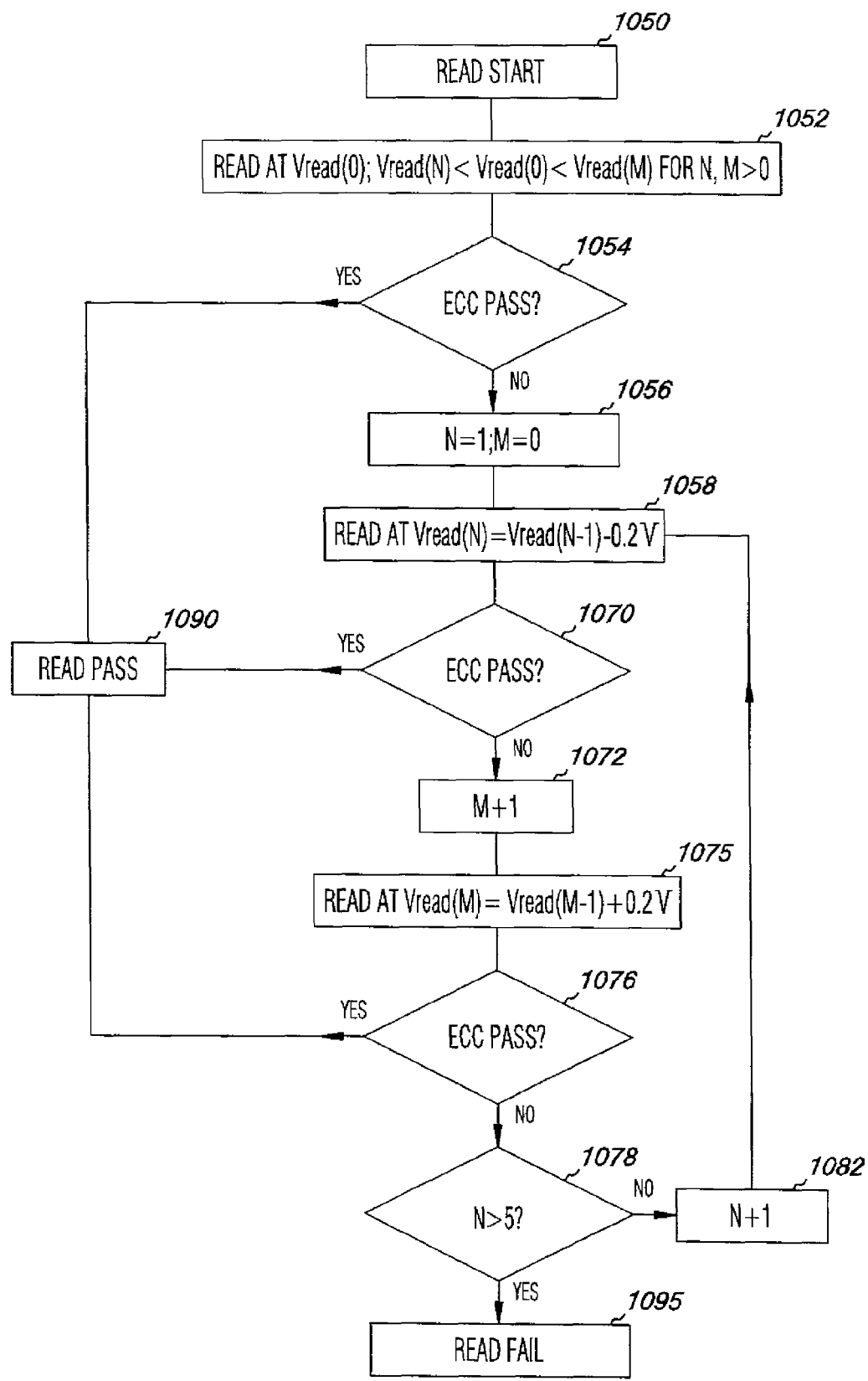
FIG. 10 illustrates another flow diagram for performing read operations according to an embodiment of the present disclosure.

FIG. 10 illustrates another method for reducing read failures according to an embodiment of the present disclosure. At step 1050 a data read is initiated. The read initiation can result in the generation of a read address, which can be decoded by support circuitry associated with the memory array.

At step 1052 an initial read operation is performed at an initial read potential. Vread(0), e.g., by using an initial read potential of about 4.5 to 5.5 volts. That is, the cell or cells, e.g., data word, corresponding to the requested read address can be read, e.g., their states can be determined, by applying the initial read potential to the unselected word lines, e.g., word lines adjacent the word line being read.

In the embodiment illustrated in FIG. 10, Vread(N) represents subsequently applied read potentials lower than the initial read potential Vread(0) for values of N greater than 0. Also, Vread(M) represents subsequently applied read potentials higher than the initial read potential Vread(0) for values of M greater than 0. In the embodiment of FIG. 10, the indicator "N" is used as a counter such that Vread(N=1) is a first subsequent lower read potential and Vread(N=2) is a second subsequent lower read potential, etc. Similarly, the indicator "M" is used as a counter such that Vread(M=1) is a first subsequent higher read potential and Vread(M=2) is a second subsequent higher read potential, etc.

At step 1054 the read data is checked using a ECC technique to determine whether the data contains erroneous bits and whether the erroneous bits are correctable by the ECC. In the event that the ECC check passes, the read data can be provided to a controller at step 1090, e.g., READ PASS, which can use the provided data to execute a process or to perform some other function.

On the other hand, if the ECC check 1054 does not result in a ECC pass, then N is set to 1 and M is set to 0 at step 1056 and a first subsequent lower read operation is performed at step 1058 using a lower read potential Vread(N). As shown at 1058, in this embodiment, the first subsequent lower read operation, Vread(N=1), is performed using a potential that is 0.2 volts lower than the initial read potential Vread(0).

At step 1070 a ECC check is performed. An ECC check pass results in a READ PASS at step 1090. If ECC check 1070 does not result in a ECC pass, then M is incremented at step 1072 and a first subsequent higher read operation is performed at step 1075 using a higher read potential Vread(M). As shown at 1075, in this embodiment, the first subsequent higher read operation, Vread(M=1), is performed using a potential that is 0.2 volts higher than the initial read potential Vread(0).

At step 1076 a subsequent ECC check is performed. An ECC check pass at step 1076 results in a READ PASS at step 1090. If ECC check 1076 does not result in a ECC pass, then it is determined whether a particular count lower and higher read operation cycles have occurred at step 1078, e.g., whether N is greater than 5 in this example. In this embodiment, a lower and higher read operation cycle refers to a single subsequent lower read operation of step 1058 and the corresponding subsequent higher read operation of step 1075. As an example, in this embodiment, the step 1078 determination of whether the number of cycles is greater than 5 can be considered a determination of whether 10 subsequent read operations have occurred, e.g., whether 5 subsequent lower read operations and 5 subsequent higher read operations have occurred.

In various embodiments the particular count of subsequent higher and lower read operation cycles can be more or less than 5. For example, in various embodiments the particular cycle count can be at least two. In some embodiments, the particular cycle count can be 1, 3, 5, 8, 15, among other values. In the event that N is greater than the cycle count, a read failure is indicated at step 1095.

On the other hand, if it is determined that the particular cycle count has not been exceeded, e.g., N is less than 5 as shown at 1078, then N is incremented at step 1082 and next subsequent lower and higher read operation cycles are performed at next lower and next higher read potentials until a subsequent ECC check pass occurs or until N reaches the particular count of cycles.

In this embodiment, each subsequent lower read operation uses a read potential that is stepped lower by increments of 0.2 volts as shown at 1058. Similarly, each subsequent higher read operation uses a read potential that is stepped higher by increments of 0.2 volts. However, embodiments are not limited to a particular stepped increment. That is, subsequent reads can be performed using stepped increments other than 0.2 volts, e.g., 0.1 volts, 0.25 volts, 0.3 volts, 0.5 volts, 1.0 volts, etc. Also, in some embodiments, the subsequent read operation can use read potentials stepped at different increments. For instance, if the initial Vread(0) is 5.0 volts, then Vread(N=1) can be 4.8 volts, Vread(N=2) can be 4.5 volts, and Vread(N=3) can be 4.0 volts. In this example, Vread (M=1) can be 5.2 volts, Vread(M=2) can be 5.5 volts, and Vread(M=3) can be 6.0 volts. Also, in some embodiments, the lower stepped increment and higher stepped increments may not be the same.

In various embodiments, the method of FIG. 10 can reduce read failure occurrences. In cases in which a group of cells being read includes marginal cells, e.g., cells having a cell current near the trip point for a state into which they were configured, performing subsequent read operations by alternating between a next lower potential read operation and a next higher read potential read operation when performing subsequent read operations can shift the cell current in marginal cells such that one or more marginal cells changes from an incorrect to a correct state. In such embodiments, a subsequent ECC check pass can occur when a prior ECC check on the same cells resulted in a ECC fail.

Figure 11:
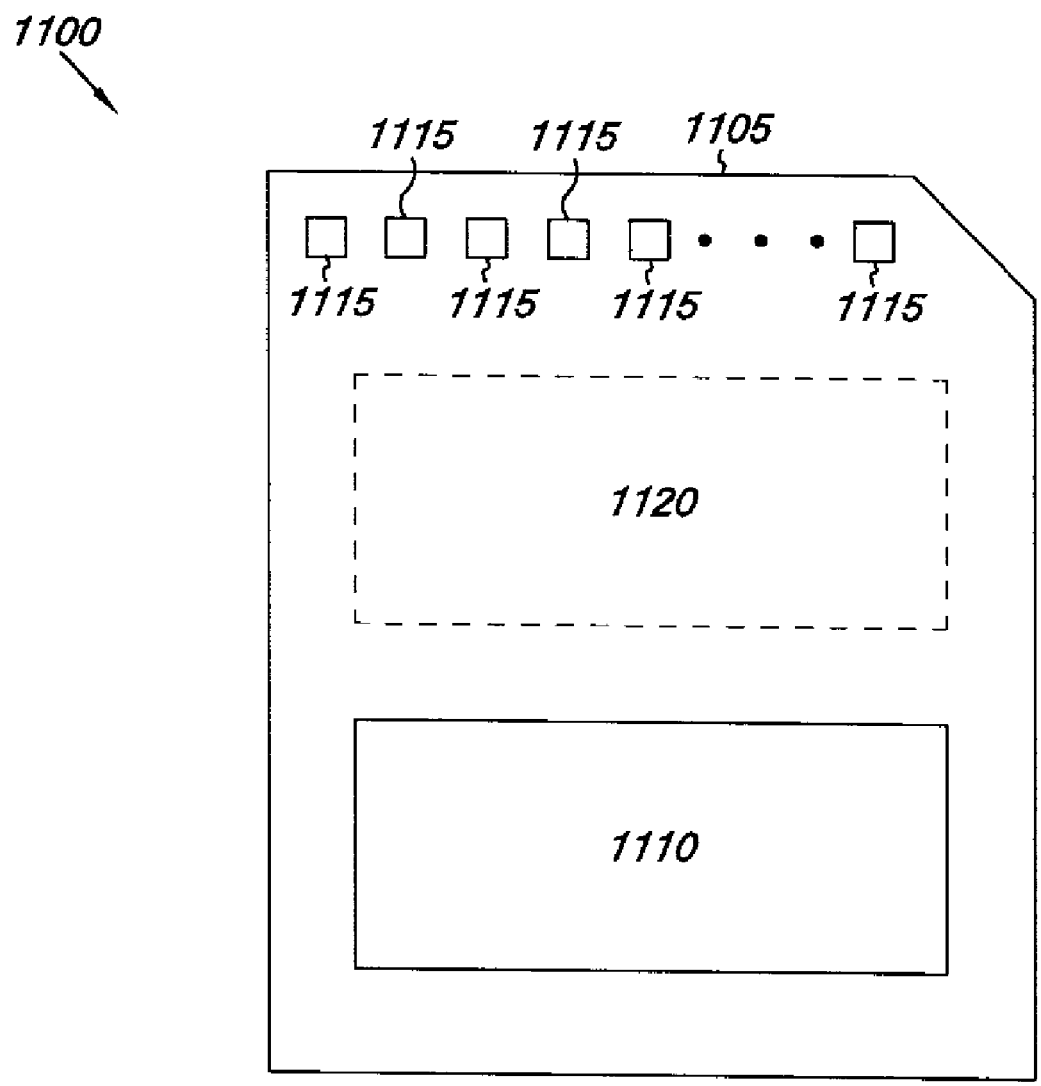
FIG. 11 is a functional block diagram of a memory module having at least one memory device in accordance with an embodiment of the present disclosure.

FIG. 11 is a functional block diagram of a memory module having at least one memory device in accordance with an embodiment of the present disclosure. Memory module 1100 is illustrated as a memory card, although the concepts discussed with reference to memory module 1100 are applicable to other types of removable or portable memory (e.g., USB flash drives) and are intended to be within the scope of "memory module" as used herein. In addition, although one example form factor is depicted in FIG. 11, these concepts are applicable to other form factors as well.

In some embodiments, memory module 1100 will include a housing 1105 (as depicted) to enclose one or more memory devices 1110, though such a housing is not essential to all devices or device applications. At least one memory device 1110 is a non-volatile memory having an architecture in accordance with an embodiment of the present disclosure. Where present, the housing 1105 includes one or more contacts 1115 for communication with a host device. Examples of host devices include digital cameras, digital recording and playback devices, PDAs, personal computers, memory card readers, interface hubs and the like. For some embodiments, the contacts 1115 are in the form of a standardized interface. For example, with a USB flash drive, the contacts 1115 might be in the form of a USB Type-A male connector. For some embodiments, the contacts 1115 are in the form of a semi-proprietary interface, such as might be found on Compact-Flash™ memory cards licensed by SanDisk Corporation, Memory Stick™ memory cards licensed by Sony Corporation, SD Secure Digital™ memory cards licensed by Toshiba Corporation and the like. In general, however, contacts 1115 provide an interface for passing control, address and/or data signals between the memory module 1100 and a host having compatible receptors for the contacts 1115.

The memory module 1100 may optionally include additional circuitry 1120, which may be one or more integrated circuits and/or discrete components. For some embodiments, the additional circuitry 1120 may include a memory controller for controlling access across multiple memory devices 1110 and/or for providing a translation layer between an external host and a memory device 1110. For example, there may not be a one-to-one correspondence between the number of contacts 1115 and a number of 1110 connections to the one or more memory devices 1110. Thus, a memory controller could selectively couple an I/O connection (not shown in FIG. 11) of a memory device 1110 to receive the appropriate signal at the appropriate I/O connection at the appropriate time or to provide the appropriate signal at the appropriate contact 1115 at the appropriate time. Similarly, the communication protocol between a host and the memory module 1100 may be different than what is required for access of a memory device 1110. A memory controller could then translate the command sequences received from a host into the appropriate command sequences to achieve the desired access to the memory device 1110. Such translation may further include changes in signal voltage levels in addition to command sequences.

The additional circuitry 1120 may further include functionality unrelated to control of a memory device 1110 such as logic functions as might be performed by an ASIC. Also, the additional circuitry 1120 may include circuitry to restrict read or write access to the memory module 1100, such as password protection, biometrics or the like. The additional circuitry 1120 may include circuitry to indicate a status of the memory module 1100. For example, the additional circuitry 1120 may include functionality to determine whether power is being supplied to the memory module 1100 and whether the memory module 1100 is currently being accessed, and to display an indication of its status, such as a solid light while powered and a flashing light while being accessed. The additional circuitry 1120 may further include passive devices, such as decoupling capacitors to help regulate power requirements within the memory module 1100.

CONCLUSION

Methods, devices, systems, and modules embodiments for non-volatile memory cell read failure reduction have been described. Performing a number of subsequent read operations using read potentials stepped to a higher and lower read potential to a particular count of read operations can reduce a read failure rate which can improve system performance by reducing and or preventing system failures.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A memory device, comprising:
an array of non-volatile memory cells; and
a controller configured to:
sense a group of the memory cells using a first read potential to provide first sensed data;
error check the first sensed data; and
responsive to the first sensed data not passing the error check, sense the group of memory cells again using a second read potential to provide second sensed data.

2. The memory device of claim 1, wherein the first sensed data does not pass the error check when more than a threshold number of bits in the first sensed data are determined to be erroneous.

3. The memory device of claim 1, wherein the controller is further configured to:
error check the second sensed data; and
responsive to the second sensed data not passing the error check, sense the group of the memory cells again to provide third sensed data.

4. The memory device of claim 1, wherein the second read potential is less than the first read potential.

5. The memory device of claim 1, wherein the second read potential is more than the first read potential.

6. The memory device of claim 5, wherein the first and second read potentials are applied to memory cells adjacent to the group of memory cells.

7. The memory device of claim 1, wherein the first sensed data does not pass the error check when the first sensed data includes a number of incorrect bits that are not correctable by the controller.

8. The memory device of claim 1, wherein the array and the controller are on the same chip.

9. The memory device of claim 1, wherein the array and the controller are on different chips.

10. The memory device of claim 1, wherein the controller is configured to sense the group of the memory cells again to provide the second sensed data only if the group of the memory cells has been sensed less than a particular number of times.

11. The memory device of claim 1, wherein the controller comprises a control state machine, a memory controller, or a processor.

12. The memory device of claim 1, wherein the sensed data comprises read data.

13. The memory device of claim 1, wherein the sensed data comprises program verify data.

14. A memory device, comprising:
an array of non-volatile memory cells; and
a controller coupled to the array and configured to:
perform a first sensing operation, using an initial read potential, to determine a state of a selected memory cell;
determine whether the state of the selected memory cell is an incorrect state by performing a first check using a data checking technique; and
if the incorrect state is determined, perform at least one subsequent sensing operation using a read potential stepped to at least one of:
a higher read potential; and
a lower read potential either a higher or a lower read potential.

15. The memory device of claim 14, wherein the selected cell is located in a string of memory cells, and wherein the initial read potential used to perform the first sensing operation and the read potential used in the at least one subsequent sensing operation are applied to unselected memory cells in the string.

16. The memory device of claim 15, wherein the controller is configured to apply a read reference potential to the selected memory cell during the first sensing operation and the at least one subsequent sensing operation.

17. The memory device of claim 16, wherein the read reference potential is lower than the initial read potential.

18. A memory device, comprising:
an array of non-volatile memory cells; and
a controller coupled to the array and configured to:
perform a first sensing operation by applying a first potential to a selected word line and an initial read potential, different than the first potential, to a number of unselected word lines to determine first sensed data corresponding to a group of cells on the selected word line;
perform a check to determine whether the first sensed data includes more than a threshold number of bits having an incorrect state after the first sensing operation; and
when greater than the threshold number bits has the incorrect state, performing at least one subsequent sensing operation using a read potential different than the initial read potential.

19. The memory device of claim 18, wherein the controller is configured to perform a subsequent check on the group after each of the at least one subsequent sensing operations, up to a particular count of checks.

20. The memory device of claim 18, wherein the controller is configured to:
perform a first subsequent sensing operation by applying a higher read potential to the unselected word lines; and
perform a second subsequent sensing operation by applying a next higher read potential to the unselected word lines.

21. The memory device of claim 18, wherein the controller is configured to
perform a first subsequent sensing operation by applying a lower read potential to the unselected word lines; and
perform a second subsequent read operation by applying a next lower read potential to the unselected word lines.

22. The memory device of claim 18, wherein the controller is configured to perform the at least one subsequent sensing operation by alternating between using a next lower read potential and a next higher read potential for a number of subsequently performed sensing operations.

* * * * *

UNITED STATES PATENT AND TRADEMARK OFFICE
CERTIFICATE OF CORRECTION

PATENT NO. : 8,116,135 B2  
APPLICATION NO. : 12/917241  
DATED : February 14, 2012  
INVENTOR(S) : Seiichi Aritome Page 1 of 1

It is certified that error appears in the above-identified patent and that said Letters Patent is hereby corrected as shown below:

In column 20, line 13, in Claim 14, delete "potential" and insert -- potential, --, therefor.

In column 20, line 56, in Claim 21, after "to" insert -- : --.

Signed and Sealed this  
Tenth Day of April, 2012

David J. Kappos  
*Director of the United States Patent and Trademark Office*